United States Patent
Kim et al.

(10) Patent No.: US 10,210,795 B2
(45) Date of Patent: Feb. 19, 2019

(54) LED DISPLAY MODULE

(71) Applicant: LUMENS CO., LTD., Yongin-si, Gyeonggi-do (KR)

(72) Inventors: Jinmo Kim, Yongin-si (KR); Keunoh Kim, Yongin-si (KR); Junhyung Lim, Yongin-si (KR); Huikyeong Noh, Yongin-si (KR); Seongbok Yoon, Yongin-si (KR); Jinwon Choi, Yongin-si (KR); Jimin Her, Yongin-si (KR); Younghwan Shin, Yongin-si (KR); Kyujin Lee, Yongin-si (KR); Sol Han, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 15/814,253

(22) Filed: Nov. 15, 2017

(65) Prior Publication Data

US 2018/0190184 A1    Jul. 5, 2018

(30) Foreign Application Priority Data

Jan. 2, 2017    (KR) .................. 10-2017-0000451
Feb. 17, 2017   (KR) .................. 10-2017-0021349
Mar. 16, 2017   (KR) .................. 10-2017-0033026

(51) Int. Cl.
| | | |
|---|---|---|
| G09G 3/32 | (2016.01) | |
| G02F 1/133 | (2006.01) | |
| B41J 2/45 | (2006.01) | |
| H01L 27/15 | (2006.01) | |
| H01L 25/075 | (2006.01) | |
| H04N 13/337 | (2018.01) | |

(Continued)

(52) U.S. Cl.
CPC ........... *G09G 3/32* (2013.01); *H01L 25/0753* (2013.01); *H01L 27/3241* (2013.01); *G09G 2300/0452* (2013.01); *G09G 2310/0264* (2013.01)

(58) Field of Classification Search
CPC ...... H01L 33/48; H01L 25/0756; H01L 27/15
See application file for complete search history.

(56) References Cited

U.S. PATENT DOCUMENTS 4,916,464 A * 4/1990 Ito ............................. B41J 2/45
                                                       347/237
6,667,497 B1 * 12/2003 Huang ................ H01L 25/0753
                                                       257/81

(Continued)

FOREIGN PATENT DOCUMENTS

JP     2002-261335 A    9/2002
JP     2008-159767 A    7/2008

(Continued)

*Primary Examiner* — Lin Li
(74) *Attorney, Agent, or Firm* — Mei & Mark LLP

(57) ABSTRACT

An LED display module is disclosed. The LED display module includes a substrate; a plurality of multi-pixel packages arrayed in a matrix with rows and columns, respectively, each of the multi-pixel packages including a package substrate and two or more pixels located on the package substrate and each of the pixels including a red LED chip, a green LED chip, and a blue LED chip; and a driver IC adapted to independently control the pixels of the multi-pixel packages. Anode terminals of the LED chips in the pixels adjacent in the row direction are connected in common to one another such that the pixels are scanned in rows in response to scan signals.

9 Claims, 11 Drawing Sheets

(51) Int. Cl.
  *H05K 1/02*    (2006.01)
  *H01L 33/48*   (2010.01)
  *H01L 27/32*   (2006.01)

(56) References Cited

U.S. PATENT DOCUMENTS

2013/0093963 A1* 4/2013 Kasai ................ G02F 1/133603
                                                 348/739
2014/0312378 A1* 10/2014 Hsue ................... H01L 27/15
                                                 257/99
2016/0245491 A1* 8/2016 Kim .................... H05K 1/0274
2017/0288093 A1* 10/2017 Cha .................... H01L 25/0756
2017/0365585 A1* 12/2017 An ..................... H01L 25/0753
2018/0059429 A1* 3/2018 Huber ................. H04N 13/337

FOREIGN PATENT DOCUMENTS

| | | | | |
|---|---|---|---|---|
| JP | 2016-525282 A | 8/2016 | | |
| KR | 10-2011-0098912 A | 9/2011 | | |
| KR | 10-2012-0040224 A | 4/2012 | | |
| KR | 20130145085 | * 11/2013 | ............. | H01L 33/48 |
| KR | 101484915 | * 1/2015 | ............. | H01L 33/48 |
| KR | 10-2015-0109357 A | 10/2015 | | |
| KR | 10-2016-0006339 A | 1/2016 | | |

* cited by examiner (a) Before     (b) After (a) TOP (b) Layer1 (L1)

(c) Layer2 (L2)

(d) Layer3 (L3)

(a)

(b)

(a) TOP          (b) Layer1 (L10)

(c) Layer2 (L20)

(a)

(b) II-II section (c) III-III section

LED DISPLAY MODULE

BACKGROUND OF THE INVENTION

1. Field of the Invention

The present invention relates to an LED display module.

2. Description of the Related Art

Full-color LED display modules in which LEDs emitting light at different wavelengths are grouped into pixels have been proposed as potential replacements for display modules using LEDs as backlight light sources. Each pixel consists of red, green, and blue LEDs or red, green, blue, and white LEDs. In such an LED display module, red, green, and blue LEDs are fabricated in packages and are mounted on a substrate. However, when the distances between the constituent LEDs of each pixel are above a predetermined level, high-quality resolution is difficult to obtain.

Single-pixel packages have been proposed in which red, green, and blue LED chips are mounted to constitute one pixel. When such single-pixel packages are used to fabricate LED display modules, a large number of terminals are required to individually drive LEDs, including red, green, and blue LEDs. The large number of terminals involves many limitations in implementing routing, increases the possibility of shorting, and causes limitations in designing circuits on substrates mounted with LED packages.

In an attempt to overcome these disadvantages, a proposal has been made for a single-pixel package including a total of four terminals consisting of three cathode terminals and one common anode terminal. Such single-pixel packages are arrayed on a substrate to create a digital signage such that intended LED pitches and resolution are achieved. However, with increasing demand to reduce the density of pixels per screen area, the application of single-pixel LED packages, each including four terminals, also involves many limitations in designing circuits on substrates owing to minimum pitches between the terminals. The limited circuit design requires sophisticated interconnection structures on substrates. This incurs an increased processing cost, leading to an increase in fabrication cost. Thus, there is a need in the art to provide a solution to these problems.

SUMMARY OF THE INVENTION

The present invention is directed to providing an improved LED display module that does not suffer from limitations in designing a circuit on a substrate and can efficiently eliminate difficulties encountered when interconnection lines are formed on the substrate.

An LED display module according to one aspect of the present invention includes: a substrate; a plurality of multi-pixel packages arrayed in a matrix with rows and columns, respectively, each of the multi-pixel packages including a package substrate and two or more pixels located on the package substrate and each of the pixels including a red LED chip, a green LED chip, and a blue LED chip; and a driver IC adapted to independently control the pixels of the multi-pixel packages, wherein anode terminals of the LED chips in the pixels adjacent in the row direction are connected in common to one another such that the pixels are scanned in rows in response to scan signals.

According to one embodiment, each of the multi-pixel packages includes common electrode pads disposed on the upper surface of the package substrate and assigned to the respective pixels.

According to one embodiment, the common electrode pads adjacent in the row direction in each of the multi-pixel packages are connected to each other on the upper surface of the package substrate.

According to one embodiment, each of the multi-pixel packages includes the same number of common terminals disposed on the bottom surface of the package substrate as the number of the rows.

According to one embodiment, each of the multi-pixel packages includes common connection means through which the common electrode pads are connected to the common terminals.

According to one embodiment, the multi-pixel packages adjacent in the row direction receive common scan signals applied to row-wise interconnection lines through the common terminals disposed in the multi-pixel packages.

According to one embodiment, each of the multi-pixel packages includes individual electrode pads disposed on the upper surface of the package substrate and to which cathode terminals of the LED chips are connected independently.

According to one embodiment, the individual electrode pads may be arrayed in lines in the column direction.

According to one embodiment, the individual electrode pads may be arrayed in lines in the row direction.

According to one embodiment, each of the multi-pixel packages includes R terminals, G terminals, and B terminals disposed on the bottom surface of the package substrate for the red LED chips, the green LED chips, and the blue LED chips, respectively, and each of the numbers of the R terminals, the G terminals, and the B terminals in each multi-pixel package is the same as the number of the columns in the multi-pixel package.

According to one embodiment, each of the multi-pixel packages includes R connection means through which the R individual electrode pads are connected to the R terminals, G connection means through which the G individual electrode pads are connected to the G terminals, and B connection means through which the B individual electrode pads are connected to the B terminals.

According to one embodiment, each of the multi-pixel packages includes a first pixel located in the first row and the first column, a second pixel located in the first row and the second column, a third pixel located in the second row and the first column, and a fourth pixel located in the second row and the second column.

According to one embodiment, each of the multi-pixel packages includes a first R terminal to which the cathode terminal of the red LED chip in the first pixel is connected in common and the cathode terminal of the red LED chip in the third pixel are connected in common through first R connection means, a first G terminal to which the cathode terminal of the green LED chip in the first pixel and the cathode terminal of the green LED chip in the third pixel are connected in common through first G connection means, a first B terminal to which the cathode terminal of the blue LED chip in the first pixel and the cathode terminal of the blue LED chip in the third pixel are connected in common through first B connection means, a second R terminal to which the cathode terminal of the red LED chip in the second pixel and the cathode terminal of the red LED chip in the fourth pixel are connected in common through second R connection means, a second G terminal to which the cathode terminal of the green LED chip in the second pixel and the cathode terminal of the green LED chip in the fourth pixel are connected in common through second G connection means, a second B terminal to which the cathode terminal of the blue LED chip in the second pixel and the cathode terminal of the blue LED chip in the fourth pixel are connected in common through second B connection means, a first common terminal to which the anode terminals of the red LED chip, the green LED chip, and the blue LED chip in the first pixel and the anode terminals of the red LED chip, the green LED chip, and the blue LED chip in the second pixel are connected in common through first common connection means, and a second common terminal to which the anode terminals of the red LED chip, the green LED chip, and the blue LED chip in the third pixel and the anode terminals of the red LED chip, the green LED chip, and the blue LED chip in the fourth pixel are connected in common through second common connection means; the first pixel, the second pixel, the third pixel, and the fourth pixel are located on the upper surface of the substrate; and the first R terminal, the first G terminal, the first B terminal, the second R terminal, the second G terminal, the second B terminal, the first common terminal, and the second common terminal are disposed on the bottom surface of the package substrate.

According to one embodiment, each of the multi-pixel packages includes a first R individual electrode pad disposed on the upper surface of the package substrate to connect the first R connection means to the cathode terminal of the red LED chip in the first pixel, a third R individual electrode pad disposed on the upper surface of the package substrate to connect the first R connection means to the cathode terminal of the red LED chip in the third pixel, a first G individual electrode pad disposed on the upper surface of the package substrate to connect the first G connection means to the cathode terminal of the green LED chip in the first pixel, a third G individual electrode pad disposed on the upper surface of the package substrate to connect the first G connection means to the cathode terminal of the green LED chip in the third pixel, a first B individual electrode pad disposed on the upper surface of the package substrate to connect the first B connection means to the cathode terminal of the blue LED chip in the first pixel, a third B individual electrode pad disposed on the upper surface of the package substrate to connect the first B connection means to the cathode terminal of the blue LED chip in the third pixel, a second R individual electrode pad disposed on the upper surface of the package substrate to connect the second R connection means to the cathode terminal of the red LED chip in the second pixel, a fourth R individual electrode pad disposed on the upper surface of the package substrate to connect the second R connection means to the cathode terminal of the red LED chip in the fourth pixel, a second G individual electrode pad disposed on the upper surface of the package substrate to connect the second G connection means to the cathode terminal of the green LED chip in the second pixel, a fourth G individual electrode pad disposed on the upper surface of the package substrate to connect the second G connection means to the cathode terminal of the green LED chip in the fourth pixel, a second B individual electrode pad disposed on the upper surface of the package substrate to connect the second B connection means to the cathode terminal of the blue LED chip in the second pixel, a fourth B individual electrode pad disposed on the upper surface of the package substrate to connect the second B connection means to the cathode terminal of the blue LED chip in the fourth pixel, a first common electrode pad disposed on the upper surface of the package substrate to connect the anode terminals of the red LED chip, the green LED chip, and the blue LED chip in the first pixel and the anode terminals of the red LED chip, the green LED chip, and the blue LED chip in the second pixel to the first common connection means, and a second common electrode pad disposed on the upper surface of the package substrate to connect the anode terminals of the red LED chip, the green LED chip, and the blue LED chip in the third pixel and the anode terminals of the red LED chip, the green LED chip, and the blue LED chip in the fourth pixel to the second common connection means.

According to one embodiment, the first R individual electrode pad, the first G individual electrode pad, and the first B individual electrode pad may be arrayed in a line in the column direction, the second R individual electrode pad, the second G individual electrode pad, and the second B individual electrode pad may be arrayed in a line in the column direction, the third R individual electrode pad, the third G individual electrode pad, and the third B individual electrode pad may be arrayed in a line in the column direction, and the fourth R individual electrode pad, the fourth G individual electrode pad, and the fourth B individual electrode pad may be arrayed in a line in the column direction.

According to one embodiment, the first R individual electrode pad, the first G individual electrode pad, and the first B individual electrode pad may be arrayed in a line in the row direction, the second R individual electrode pad, the second G individual electrode pad, and the second B individual electrode pad may be arrayed in a line in the row direction, the third R individual electrode pad, the third G individual electrode pad, and the third B individual electrode pad may be arrayed in a line in the row direction, and the fourth R individual electrode pad, the fourth G individual electrode pad, and the fourth B individual electrode pad may be arrayed in a line in the row direction.

The improved LED display module of the present invention includes multi-pixel packages arrayed in a matrix on a substrate and each including a plurality of pixels. Anode terminals of LED chips in the multi-pixel packages are connected in common in the row direction such that the pixels are scanned in rows in response to scan signals. Due to this construction, efficient interconnection can be accomplished upon substrate design.

In addition, multi-pixel packages including a greatly reduced number of terminals per pixel are used in the LED display module of the present invention compared to in conventional LED display modules. This construction is effective in increasing the degree of freedom of circuit design on a substrate.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Embodiments of the present invention will now be described with reference to the accompanying drawings. It should be noted that the drawings and embodiments described with reference to the drawings are simplified and illustrated such that those skilled in the art can readily understand the present invention.

Figure 1:
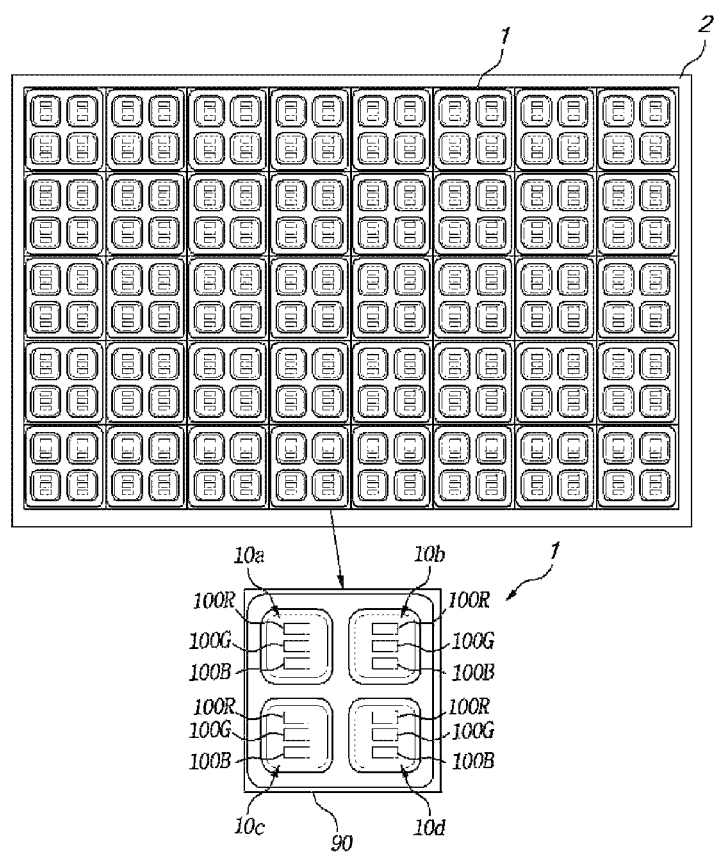
FIG. 1 illustrates an LED display module according to one aspect of the present invention in which multi-pixel packages are mounted on the upper surface of a substrate.
Figure 2:
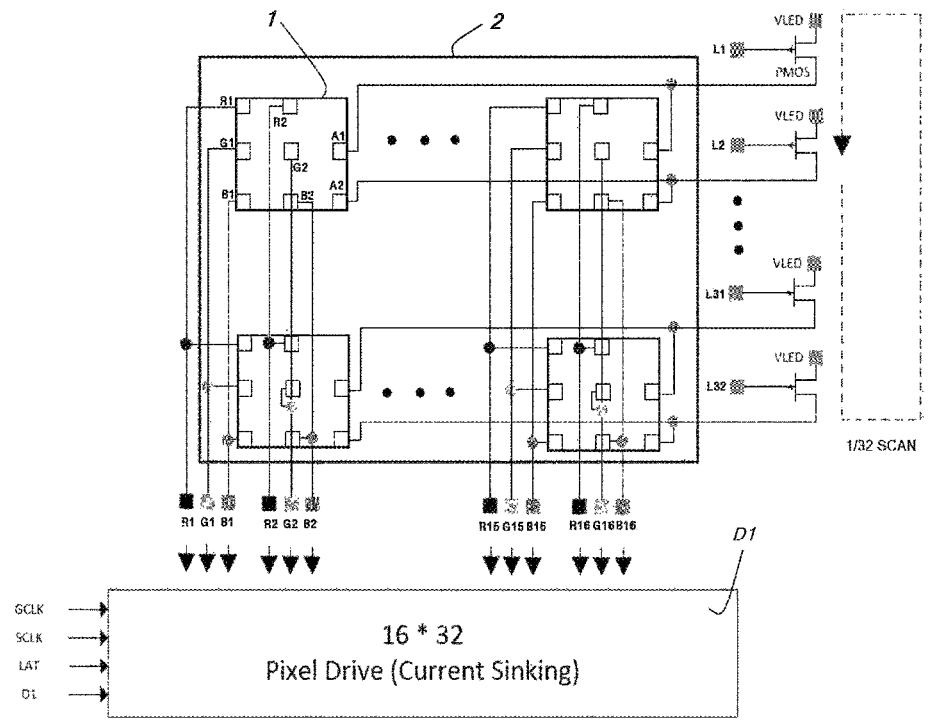
FIG. 2 illustrates an LED display module according to one aspect of the present invention including multi-pixel packages in which common terminals and individual terminals are disposed on the bottom surfaces of package substrates and are interconnected in the row and column directions.
Figure 3:
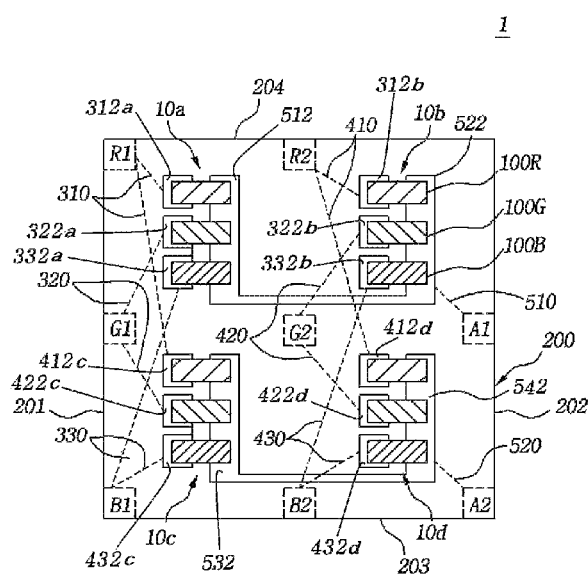
FIG. 3 is a plan view illustrating one of the multi-pixel packages illustrated in FIG. 2 from which a molded part is removed. The hidden lines indicate terminals and connection parts that are invisible when viewed from the top.

FIG. 1 illustrates an LED display module according to one aspect of the present invention in which multi-pixel packages 1 are mounted on the upper surface of a substrate 2. The term "substrate" as used herein is used to distinguish it from a "package substrate 200" in one multi-pixel package. FIG. 2 illustrates multi-pixel packages in which common terminals A1 and A2 and individual terminals R1, G1, B1, R2, G2, and B2 are disposed on the bottom surfaces of package substrates (indicated by reference numeral "200" in FIG. 3) and are interconnected in the row and column directions. FIG. 3 is a plan view illustrating one of the multi-pixel packages illustrated in FIG. 2 from which a molded part is removed. In FIG. 3, the hidden lines indicate terminals and connection parts that are invisible when viewed from the top.

In the LED display module illustrated in FIGS. 1 to 3, multi-pixel packages 1 are arrayed in a matrix. In this matrix array, the row direction is defined as the widthwise direction and the column direction is defined as the longitudinal direction. Based on these definitions, the row and column directions will be explained below. The multi-pixel packages illustrated in FIG. 2 have substantially the same structure. For convenience, only one of the multi-pixel packages is represented by reference numeral 1. Accordingly, it should be understood that the terminals R1, G1, B1, R2, G2, B2, A1, and A2 are provided in each of the multi-pixel packages.

Referring to FIG. 1 together with FIGS. 2 and 3, the LED display module includes a substrate 2, a plurality of multi-pixel packages 1, and a driver IC D1.

The plurality of multi-pixel packages 1 are arranged on the upper surface of the substrate 2. The driver IC D1 and a circuit unit are arranged on the bottom surface of the substrate 2. The circuit unit is adapted to apply scan signals in rows. That is, the circuit unit includes a circuit, i.e. a PMOSFET (PMOS), for receiving scan signals from L1 to L32 in the right-hand side of FIG. 2 and scanning pixels in rows.

Each of the multi-pixel packages 1 includes a package substrate 200 and two or more pixels, most preferably four pixels 10a, 10b, 10c, and 10d, located on the package substrate 200. Each of the pixels 10a, 10b, 10c, and 10d includes a red LED chip 100R, a green LED chip 100G, and a blue LED chip 100B. As illustrated in FIGS. 1 to 3, the four pixels 10a, 10b, 10c, and 10d are provided in each of the multi-pixel packages. However, there is no restriction on the number of pixels in each of the multi-pixel packages. The red LED chip 100R, the green LED chip 100G, and the blue LED chip 100B emit light at different wavelengths. The wavelength of light emitted from the red LED chip 100R, the green LED chip 100G or the blue LED chip 100B may also be determined only depending on the components of the corresponding compound semiconductor and may also be converted by a fluorescent material or quantum dots. In other words, the red LED chip 100R, the green LED chip 100G or the blue LED chip 100B may include a wavelength converting material, such as a fluorescent material or quantum dots. Each of the multi-pixel packages 1 may include a molded part 90 having a grid structure for isolating the pixels 10a, 10b, 10c, and 10d to prevent light interference among the pixels 10a, 10b, 10c, and 10d. Each of the multi-pixel packages 1 may further include structures adapted to isolate the LED chips in the pixels. Referring to FIG. 2, the total number of the pixels in the 8*16 multi-pixel packages is 16*32. However, there is no restriction on the number of the pixels.

The driver IC D1 is an integrated circuit for independently controlling the pixels of the multi-pixel packages 1. That is, the driver IC D1 is connected to the pixels in the column direction to supply electric currents to the pixels in response to combinations of control signals GCLK, SCLK, LAT, and D1. The driver IC D1 is connected to the LED chips 100R, 100G, and 100B in the pixels to appropriately control the colors of the pixels. As illustrated in FIG. 2, the driver IC D1 is connected to the LED chips (i.e. the red, green, and blue LED chips) in one pixel in the column direction to control the LED chips. Thus, the driver IC D1 is constructed in such a manner that when the number of the columns is 16, 3*16 channels are formed. For convenience, interconnection lines between the pixels and the driver IC D1 are referred to as "column-wise interconnection lines".

In the LED display module of the present invention, anode terminals of the LED chips in the pixels (for example, 10a and 10b or 10c and 10d) adjacent in the row direction in each multi-pixel package 1 are connected to each other to receive common scan signals such that the pixels 10a and 10b or 10c and 10d are scanned in rows in response to the scan signals. In the case of two adjacent multi-pixel packages, anode terminals of the pixels in one of the multi-pixel packages are connected to anode terminals of the adjacent pixels in the other multi-pixel packages to receive common scan signals in the row direction.

Each of the multi-pixel packages 1 is disposed on the upper surface of the package substrate 200 and includes common electrode pads 512, 522, 532, and 542 assigned to the respective pixels.

The common electrode pads (for example, 512 and 522 or 532 and 542) adjacent in the row direction in each multi-pixel package 1 are connected to each other on the upper surface of the package substrate 200. As a result, the common electrode pads 512 and 522 or 532 and 542 may be in the shape of a "U".

Each of the multi-pixel packages 1 includes common terminals A1 and A2 disposed on the bottom surface of the package substrate 200. The number of the common terminals in each multi-pixel package 1 is the same as the number of the rows. In FIG. 3, the number of the rows is 2 and the number of the common terminals is 2.

Each of the multi-pixel packages 1 includes common connection means 510 and 520 through which the common electrode pads 512, 522, 532, and 542 are connected to the common terminals A1 and A2. That is, the common electrode pads 512 and 522 are connected to the common terminal A1 through the common connection means 510 because the two common electrode pads are connected to each other and the common electrode pads 532 and 542 are connected to the common terminal A2 through the common connection means 520 because the two common electrode pads are connected to each other.

The multi-pixel packages adjacent in the row direction receive common scan signals through the respective common terminals. For convenience, interconnection lines for applying common scan signals in rows are referred to as "row-wise interconnection lines". That is, as illustrated in FIG. 2, the common terminals A1 in the multi-pixel packages adjacent in the row direction are connected to each other in the row direction to receive common scan signals and the common terminals A2 are connected to each other in the row direction to receive common scan signals.

Each of the multi-pixel packages includes individual electrode pads 312a, 322a, 332a, 312b, 322b, 332b, 412c, 422c, 432c, 412d, 422d, and 432d disposed on the upper surface of the package substrate 200 and to which cathode terminals of the LED chips are independently connected. The individual electrode pads 312a, 322a, 332a, 312b, 322b, 332b, 412c, 422c, 432c, 412d, 422d, and 432d are arrayed in lines in the column direction in the respective pixels. Herein, the cathode terminals refer to parts of the LED chips to which the individual electrode pads are connected and the anode terminals refer to parts of the LED chips to which the common electrode pads are connected.

Figure 9:
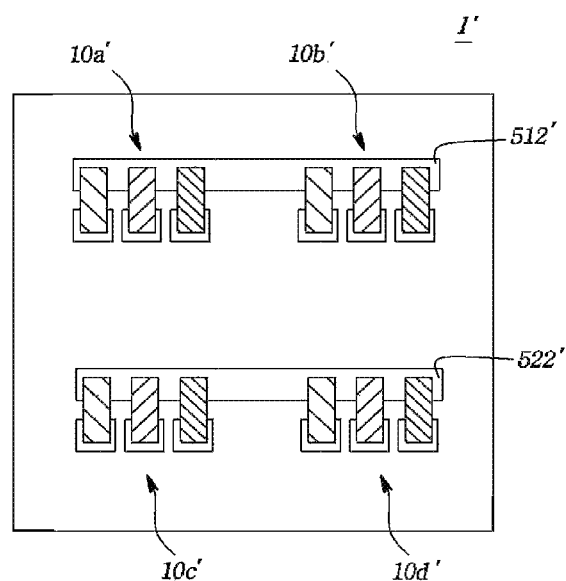
FIG. 9 illustrates an LED display module according to one aspect of the present invention in which individual electrode pads are arrayed in the row direction, which is different from the LED display module illustrated in FIG. 3 in which individual electrode pads are arrayed in the longitudinal direction.

Unlike the in-line array of the individual electrode pads in the column direction, the individual electrode pads may also be arrayed in a line in the row direction in each pixel. The in-line array of the individual electrode pads in the row direction is illustrated in FIG. 9 and will be explained hereinafter.

Each of the multi-pixel packages includes R terminals R1 and R2, G terminals G1 and G2, and B terminal B1 and B2 disposed on the bottom surface of the package substrate 200 for the red LED chips, the green LED chips, and the blue LED chips, respectively. Each of the numbers of the R terminals, the G terminals, and the B terminals in each multi-pixel package is the same as the number of the columns in the multi-pixel package. That is, when the number of the columns is 2, two R terminals, two G terminals, and two B terminals are disposed on the bottom surface of the package substrate 200.

Each of the multi-pixel packages includes R connection means 310 through which the R individual electrode pads 312a and 412 care connected to the R terminal R1, R connection means 410 through which the R individual electrode pads 312b and 412d are connected to the R terminal R2, G connection means 320 through which the G individual electrode pads 322a and 422 care connected to the G terminal G1, G connection means 420 through which the G individual electrode pads 322 band 422d are connected to the G terminal G2, B connection means 330 through which the B individual electrode pads 332a and 432 care connected to the B terminal B1, and B connection means 430 through which the B individual electrode pads 332b and 432d are connected to the B terminal B2. Specifically, the R connection means 310 connects the R individual electrode pads 312a and 412c to the R terminal R1, the R connection means 410 connects the R individual electrode pads 312b and 412d to the R terminal R2, the G connection means 320 connects the G individual electrode pads 322b and 422c to the G terminal G1, the G connection means 420 connects the G individual electrode pads 322b and 422d to the G terminal G2, the B connection means 330 connects the B individual electrode pads 332a and 432c to the B terminal B1, and the B connection means 430 connects the B individual electrode pads 332b and 432d to the B terminal B2.

More specifically, the first R individual electrode pad 312a connects the first R connection means 310 to the cathode terminal of the red LED chip in the first pixel 10a and the third R individual electrode pad 412c connects the first R connection means 310 to the cathode terminal of the red LED chip in the third pixel 10c. The second R individual electrode pad 312b connects the second R connection means 410 to the cathode terminal of the red LED chip in the second pixel 10b and the fourth individual electrode pad 412d connects the second R connection means 410 to the cathode terminal of the red LED chip in the fourth pixel 10d. The first G individual electrode pad 322a connects the first G connection means 320 to the cathode terminal of the green LED chip in the first pixel 10a and the third G individual electrode pad 422c connects the first G connection means 320 to the cathode terminal of the green LED chip in the third pixel 10c. The second G individual electrode pad 322b connects the second connection means 420 to the cathode terminal of the green LED chip in the second pixel 10b and the fourth G individual electrode pad 422d connects the second connection means 420 to the cathode terminal of the green LED chip in the fourth pixel 10d. The first B individual electrode pad 332a connects the first B connection means 330 to the cathode terminal of the blue LED chip in the first pixel 10a and the third B individual electrode pad 432c connects the first B connection means 330 to the cathode terminal of the blue LED chip in the third pixel 10c. The second B individual electrode pad 332b connects the second B connection means 430 to the cathode terminal of the blue LED chip in the second pixel 10b and the fourth B individual electrode pad 432d connects the second B connection means 430 to the cathode terminal of the blue LED chip in the fourth pixel 10d.

As illustrated in FIG. 3, the first R individual electrode pad 312a, the first G individual electrode pad 322a, and the first B individual electrode pad 332a are arrayed in a line in the column direction, the second R individual electrode pad 312b, the second G individual electrode pad 322b, and the second B individual electrode pad 332b are arrayed in a line in the column direction, the third R individual electrode pad 412c, the third G individual electrode pad 422c, and the third B individual electrode pad 432c are arrayed in a line in the column direction, and the fourth R individual electrode pad 412d, the fourth G individual electrode pad 422d, and the fourth B individual electrode pad 432d are arrayed in a line in the column direction.

Alternatively, the individual electrode pads in each of the pixels may be arrayed in a line in the row direction. That is, the first R individual electrode pad, the first G individual electrode pad, and the first B individual electrode pad in the first pixel may be arrayed in a line in the row direction, the second R individual electrode pad, the second G individual electrode pad, and the second B individual electrode pad in the second pixel may be arrayed in a line in the row direction, the third R individual electrode pad, the third G individual electrode pad, and the third B individual electrode pad in the third pixel may be arrayed in a line in the row direction, and the fourth R individual electrode pad, the fourth G individual electrode pad, and the fourth B individual electrode pad in the fourth pixel may be arrayed in a line in the row direction. This array is illustrated in FIG. 9 and is mentioned in detail with reference to the corresponding drawings.

Figure 4A:
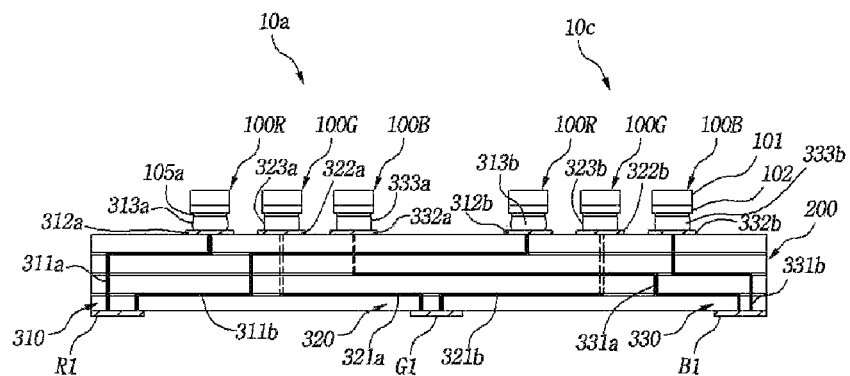
FIG. 4a is a cross-sectional view of a multi-pixel package in which cathode terminals of red LED chips, green LED chips, and blue LED chips of a first pixel and a third pixel are coupled to individual electrode pads.
Figure 4B:
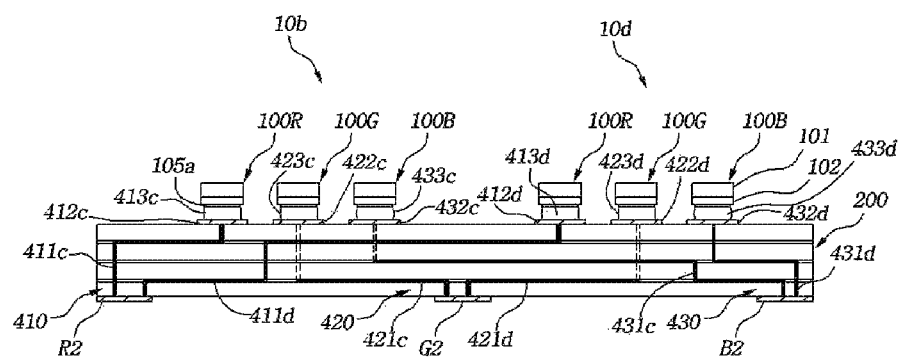
FIG. 4b is a cross-sectional view of a multi-pixel package in which cathode terminals of red LED chips, green LED chips, and blue LED chips of a second pixel and a fourth pixel are coupled to individual electrode pads.
Figure 5A:
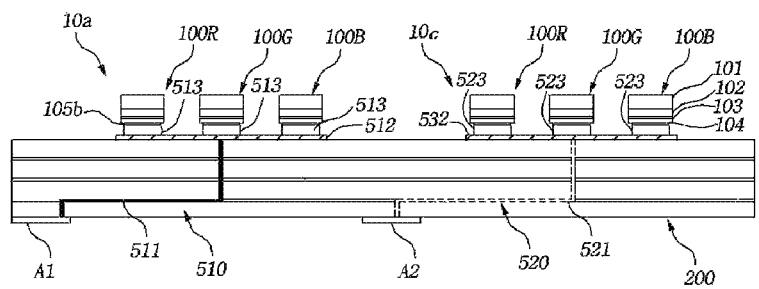
FIG. 5a is a cross-sectional view of a multi-pixel package in which anode terminals of red LED chips, green LED chips, and blue LED chips of a first pixel and a third pixel are coupled to common electrode pads.
Figure 5B:
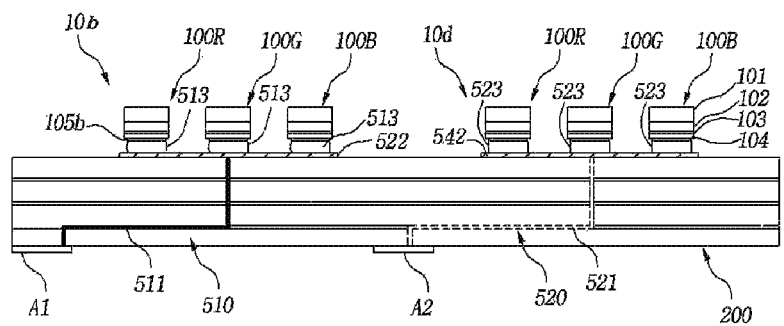
FIG. 5b is a cross-sectional view of a multi-pixel package in which anode terminals of red LED chips, green LED chips, and blue LED chips of a second pixel and a fourth pixel are coupled to common electrode pads.
Figure 6:
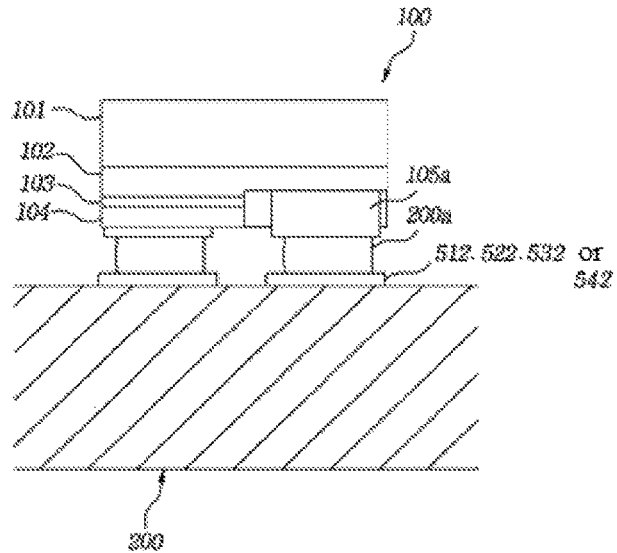
FIG. 6 is a cross-sectional view illustrating an exemplary structure of a constituent LED chip of a pixel in an LED display module according to one aspect of the present invention.

FIG. 4a is a cross-sectional view of the multi-pixel package in which the cathode terminals of the red LED chips, the green LED chips, and the blue LED chips of the first pixel 10a and the third pixel 10c are coupled to the individual electrode pads, FIG. 4b is a cross-sectional view of the multi-pixel package in which the cathode terminals of the red LED chips, the green LED chips, and the blue LED chips of the second pixel and the fourth pixel are coupled to the individual electrode pads, FIG. 5a is a cross-sectional view of the multi-pixel package in which the anode terminals of the red LED chips, the green LED chips, and the blue LED chips of the first pixel and the third pixel are coupled to the common electrode pads, FIG. 5b is a cross-sectional view of the multi-pixel package in which the anode terminals of the red LED chips, the green LED chips, and the blue LED chips of the second pixel and the fourth pixel are coupled to the common electrode pads, and FIG. 6 is a cross-sectional view illustrating an exemplary structure of the constituent LED chip of the pixel in the LED display module.

Referring to FIGS. 1 to 6, the first pixel 10a is located in the first row and the first column, the second pixel 10b is located in the first row and the second column, the third pixel 10c is located in the second row and the first column, and the fourth pixel 10d is located in the second row and the second column in each multi-pixel package 1. The following is an explanation concerning the multi-pixel package 1 in the LED display module.

As illustrated, the package substrate 200 of the multi-pixel package 1 in the LED display module is substantially square or rectangular with a first side 201, a second side 202 parallel to the first side 201, a third side 203 perpendicular to the sides 201 and 202, and a fourth side 204 parallel to the third side 203 and perpendicular to the sides 201 and 202.

In the multi-pixel package 1, the four pixels 10a, 10b, 10c, and 10d are arrayed in a matrix, specifically a matrix with two rows and two columns, on the upper surface of the package substrate 200. As simply mentioned previously, the column direction is the direction parallel to the first side 201 and the second side 202 and the column direction is the direction parallel to the third side 203 and the fourth side 204. Scan signals are applied in common along the row direction when scanned in rows and the LED chips in the pixels are connected along the column direction to receive electric currents from the driver IC D1.

The first pixel 10a is located in the first row and the first column on the upper surface of the package substrate 200, the second pixel 10b is located in the first row and the second column on the upper surface of the package substrate 200, the third pixel 10c is located in the second row and the first column on the upper surface of the package substrate 200, and the fourth pixel 10d is located in the second row and the second column on the upper surface of the package substrate 200. As mentioned above, the red LED chip 100R, the green LED chip 100G, and the blue LED chip 100B are arranged in this order in each of the first pixel 10a, the second pixel 10b, the third pixel 10c, and the fourth pixel 10d. The red, green, and blue LED chips are flip chip-type LED chips. FIG. 6 illustrates a flip chip-type LED chip that can be applied to the present invention. The LED chip is designated by reference numeral 100.

Each of the red LED chip 100R, the green LED chip 100G, and the LED chip 100B includes a structure in which a first conductive semiconductor layer 102, an active layer 103, and a second conductive semiconductor layer 104 are arranged in this order downward from one surface of a growth substrate 101. Specifically, each of the LED chips has a flip chip structure in which the first conductive semiconductor layer 102 and the second conductive semiconductor layer 104 are separated by the active layer 103 and are exposed downwardly through their stepped portions. It is noted that at least one of the LED chips may have a structure in which a first conductive electrode and/or a second conductive electrode is wire-bonded, rather than a flip chip structure.

Here, each of the red LED chip 100R, the green LED chip 100G, and the blue LED chip 100B includes a first conductive electrode 105a formed on the lower exposed area of the first conductive semiconductor layer 102 and a second conductive electrode 105b formed on the lower exposed area of the second conductive semiconductor layer 104. As mentioned earlier, the first conductive electrode 105a and the second conductive electrode 105b are called the cathode terminal and the anode terminal, respectively.

In the multi-pixel LED package 1, the first R terminal R1, the first G terminal G1, the first B terminal B1, the second R terminal R2, the second G terminal G2, the second B terminal B2, the first common terminal A1, and the second common terminal A2 are spaced apart from one another on the bottom surface of the package substrate 200. The cathode terminals of the LED chips are connected to the first R terminal R1, the first G terminal G1, the first B terminal B1, the second R terminal R2, the second G terminal G2, and the second B terminal B2. The anode terminals of the LED chips are connected to the first common terminal A1 and the second common terminal A2.

The first R terminal R1 is connected in common to the cathode terminal 105a of the red LED chip 100R in the first pixel 10a and the cathode terminal 105a of the red LED chip 100R in the third pixel 10c through the first R connection means 310. The first G terminal G1 is connected in common to the cathode terminal 105a of the green LED chip 100G in the first pixel 10a and the cathode terminal 105a of the green LED chip 100G in the third pixel 10c through the first G connection means 320. The first B terminal B1 is connected in common to the cathode terminal 105*a* of the blue LED chip 100B in the first pixel 10*a* and the cathode terminal 105*a* of the blue LED chip 100B in the third pixel 10*c* through the first B connection means 330.

The second R terminal R2 is connected in common to the cathode terminal 105*a* of the red LED chip 100R in the second pixel 10*b* and the cathode terminal 105*a* of the red LED chip 100R in the fourth pixel 10*d* through the second R connection means 410. The second G terminal G2 is connected in common to the cathode terminal 105*a* of the green LED chip 100G in the second pixel 10*b* and the cathode terminal 105*a* of the green LED chip 100G in the fourth pixel 10*d* through the second G connection means 420. The second B terminal B2 is connected in common to the cathode terminal 105*a* of the blue LED chip 100B in the second pixel 10*b* and the cathode terminal 105*a* of the blue LED chip 100B in the fourth pixel 10*d* through the second B connection means 430.

The first common terminal A1 is connected in common to the anode terminals 105*b* of the red LED chip 100R, the green LED chip 100G, and the blue LED chip 100B in the first pixel 10*a* and the anode terminals 105*b* of the red LED chip 100R, the green LED chip 100G, and the blue LED chip 100B in the second pixel 10*b* through the first common connection means 510.

The second common terminal A2 is connected in common to the anode terminals 105*b* of the red LED chip 100R, the green LED chip 100G, and the blue LED chip 100B in the second pixel 10*b* and the anode terminals 105*b* of the red LED chip 100R, the green LED chip 100G, and the blue LED chip 100B in the fourth pixel 10*d* through the second common connection means 520.

The array of the pixels 10*a*, 10*b*, 10*c*, and 10*d*, the array of the red, green, and blue LED chips 100R, 100G, and 100B in each pixel, and the connections among the eight terminals R1, G1, B1, R2, G2, B2, A1, and A2 and the terminals 105*a* and 105*b* of the LED chips 100R, 100G, and 100B enable individual control over the red, green, and blue LED chips of the pixels, as shown in Table 1.

TABLE 1

|  | First column | Second column |
| --- | --- | --- |
| First row | R LED chip (A1, R1) | R LED chip (A1, R2) |
|  | G LED chip (A1, G1) | G LED chip (A1, G2) |
|  | B LED chip (A1, B1) | B LED chip (A1, B2) |
| Second row | R LED chip (A2, R1) | R LED chip (A2, R2) |
|  | G LED chip (A2, G1) | G LED chip (A2, G2) |
|  | B LED chip (A2, B1) | B LED chip (A2, B2) |

More specifically, the LED chips of the first and second pixels 10*a* and 10*b* in the first row, i.e. the red, green, and blue LED chips included in the pixel 10*a* in the first row and the first column and the red, green, and blue LED chips included in the pixel 10*b* in the first row and the second column, receive scan signals in common through the first common terminal A1 and the LED chips of the third and fourth pixels 10*c* and 10*d* in the second row, i.e. the red, green, and blue LED chips included in the pixel 10*c* in the second row and the first column and the red, green, and blue LED chips included in the pixel 10*d* in the second row and the second column, receive scan signals in common through the second common terminal A2. In other words, the red, green, and blue LED chips of the pixels 10*a* and 10*b* in the first row and the red, green, and blue LED chips of the pixels 10*c* and 10*d* in the second row are independently controlled by the first common terminal A1 and the second common terminal A2, respectively. The red LED chips in the first column and the red LED chips in the second column are connected to the first R terminal R1 and the second R terminal R2, respectively, and are independently controlled by the driver IC D1. The green LED chips in the first column and the green LED chips in the second column are connected to the first G terminal G1 and the second G terminal G2, respectively, and are independently controlled by the driver IC D1. The blue LED chips in the first column and the blue LED chips in the second column are connected to the first B terminal B1 and the second B terminal B2, respectively, and are independently controlled by the driver IC D1.

As illustrated in FIG. 4*a*, the first R connection means 310 is connected to the first R terminal R1 through an Ra via 311*a* and an Rb via 311*b* and includes the R individual electrode pads 312*a* and 312*b* (for convenience, hereinafter referred to as an Ra electrode pad and an Rb electrode pad, respectively) spaced apart from each other on the upper surface of the package substrate 200, an Ra bump 313*a* through which the cathode terminal 105*a* of the red LED chip 100R in the first pixel 10*a* is connected to the Ra electrode pad 312*a*, and an Rb bump 313*b* through which the cathode terminal 105*a* of the red LED chip 100R in the third pixel 10*c* is connected to the Rb electrode pad 312*b*.

The package substrate 200 has a laminate structure including a plurality of unit substrate layers. At least one of the Ra via 311*a* and the Rb via 311*b* may have a bent structure including a vertical portion penetrating at least one of the unit substrate layers and a horizontal portion formed on at least one of the unit substrate layers such that intended paths are formed from the first R terminal R1 located on the bottom surface of the package substrate 200 to the Ra electrode pad 312*a* and the Rb electrode pad 312*b* located on the upper surface of the package substrate 200.

The first G connection means 320 is connected to the first G terminal G1 through a Ga via 321*a* and a Gb via 321*b* and includes the G individual electrode pads 322*a* and 322*b* (for convenience, hereinafter referred to as a Ga electrode pad and a Gb electrode pad, respectively) spaced apart from each other on the upper surface of the package substrate 200, a Ga bump 323*a* through which the cathode terminal 105*a* of the G LED chip 100G in the first pixel 10*a* is connected to the Ga electrode pad 322*a*, and a Gb bump 323*b* through which the cathode terminal 105*a* of the G LED chip 100G in the third pixel 10*c* is connected to the Gb electrode pad 322*b*. At least one of the Ga via 321*a* and the Gb via 321*b* may have a bent structure including a vertical portion penetrating at least one of the unit substrate layers and a horizontal portion formed on at least one of the unit substrate layers such that intended paths are formed from the first G terminal G1 located on the bottom surface of the package substrate 200 to the Ga electrode pad 322*a* and the Gb electrode pad 322*b* located on the upper surface of the package substrate 200.

The first B connection means 330 is connected to the first B terminal B1 through a Ba via 331*a* and a Bb via 331*b* and includes the B individual electrode pads 332*a* and 332*b* (for convenience, hereinafter referred to as a Ba electrode pad and a Bb electrode pad, respectively) spaced apart from each other on the upper surface of the package substrate 200, a Ba bump 333*a* through which the cathode terminal 105*a* of the B LED chip 100B in the first pixel 10*a* is connected to the Ba electrode pad 332*a*, and a Bb bump 333*b* through which the cathode terminal 105*a* of the B LED chip 100B in the third pixel 10*c* is connected to the Bb electrode pad 332*b*. At least one of the Ba via 331*a* and the Bb via 331*b* may have a bent structure including a vertical portion penetrating at least one of the unit substrate layers and a horizontal portion formed on at least one of the unit substrate layers such that intended paths are formed from the first B terminal B1 located on the bottom surface of the package substrate 200 to the Ba electrode pad 332a and the Bb electrode pad 332b located on the upper surface of the package substrate 200.

As illustrated in FIG. 4b, the second R connection means 410 is connected to the second R terminal R2 through an Rc via 411a and an Rd via 411b and includes the R individual electrode pads 412c and 412d (for convenience, hereinafter referred to as an Rc electrode pad and an Rd electrode pad, respectively) spaced apart from each other on the upper surface of the package substrate 200, an Rc bump 413c through which the cathode terminal 105a of the R LED chip 100R in the second pixel 10b is connected to the Rc electrode pad 412c, and an Rd bump 413d through which the cathode terminal 105a of the R LED chip 100R in the fourth pixel 10d is connected to the Rd electrode pad 412d. At least one of the Rc via 411c and the Rd via 411d may have a bent structure including a vertical portion penetrating at least one of the unit substrate layers and a horizontal portion formed on at least one of the unit substrate layers such that intended paths are formed from the second R terminal R2 located on the bottom surface of the package substrate 200 to the Rc electrode pad 412c and the Rd electrode pad 412d located on the upper surface of the package substrate 200.

The second G connection means B2 is connected to the second G terminal G2 through a Ga via 421c and a Gb via 421b and includes the G individual electrode pads 422c and 422d (for convenience, hereinafter referred to as a Gc electrode pad and a Gd electrode pad, respectively) spaced apart from each other on the upper surface of the package substrate 200, a Gc bump 423c through which the cathode terminal 105a of the G LED chip 100G in the second pixel 10b is connected to the Gc electrode pad 422c, and a Gd bump 423b through which the cathode terminal 105a of the G LED chip 100G in the fourth pixel 10d is connected to the Gd electrode pad 422d. At least one of the Gc via 421c and the Gd via 421d may have a bent structure including a vertical portion penetrating at least one of the unit substrate layers and a horizontal portion formed on at least one of the unit substrate layers such that intended paths are formed from the second G terminal G2 located on the bottom surface of the package substrate 200 to the Gc electrode pad 422c and the Gd electrode pad 422d located on the upper surface of the package substrate 200.

The second B connection means 430 is connected to the second B terminal B2 through a Bc via 431c and a Bd via 431d and includes B individual electrode pads 432c and 432c (for convenience, hereinafter referred to as a Bc electrode pad and a Bd electrode pad, respectively) spaced apart from each other on the upper surface of the package substrate 200, a Bc bump 433c through which the cathode terminal 105a of the B LED chip 100B in the second pixel 10b is connected to the Bc electrode pad 432c, and a Bd bump 433d through which the cathode terminal 105a of the B LED chip 100B in the fourth pixel 10d is connected to the Bd electrode pad 432d. At least one of the Bc via 431c and the Bd via 431d may have a bent structure including a vertical portion penetrating at least one of the unit substrate layers and a horizontal portion formed on at least one of the unit substrate layers such that intended paths are formed from the second B terminal B2 located on the bottom surface of the package substrate 200 to the Bc electrode pad 432c and the Bd electrode pad 432d located on the upper surface of the package substrate 200.

In FIG. 3, the common electrode pads 512 and 522 are connected to each other and the common electrode pads 532 and 542 are connected to each other. For convenience, the common electrode pads 512 and 522 are referred to as first common electrode pads and the common electrode pads 532 and 542 are referred to as second common electrode pads. The first common electrode pads 512 and 522 are formed on the upper surface of the package substrate 200 to connect the anode terminals of the red LED chip, the green LED chip, and the blue LED chip in the first pixel 10a and the anode terminals of the red LED chip, the green LED chip, and the blue LED chip in the second pixel 10b to the first common connection means 510. The second common electrode pads 532 and 542 are formed on the upper surface of the package substrate 200 to connect the anode terminals of the red LED chip, the green LED chip, and the blue LED chip in the third pixel 10c and the anode terminals of the red LED chip, the green LED chip, and the blue LED chip in the fourth pixel 10d to the second common connection means 520.

As illustrated in FIGS. 5a and 5b, the first common connection means 510 includes an Aa via 511, the first common electrode pads 512 and 522 connected to the first common terminal A1 through the Aa via 511, and six Aa bumps 513 through which the anode terminals 105b of the red LED chips 100R, the green LED chips 100G, and the blue LED chips 100B in the first pixel 10a and the second pixel 10b are connected to the first common electrode pads 512 and 522. The Aa via 511 may have a bent structure including a vertical portion penetrating at least one of the unit substrate layers and a horizontal portion formed on at least one of the unit substrate layers such that intended paths are formed from the first common terminal A1 located on the bottom surface of the package substrate 200 to the first common electrode pads 512 and 522 located on the upper surface of the package substrate 200.

The second common connection means 520 includes an Ab via 521, the second common electrode pads 532 and 542 connected to the second common terminal A2 through the Ab via 521, and six Ab bumps 523 through which the anode terminals 105b of the red LED chips 100R, the green LED chips 100G, and the blue LED chips 100B in the third pixel 10c and the fourth pixel 10d are connected to the second common electrode pads 532 and 542. The Ab via 521 may have a bent structure including a vertical portion penetrating at least one of the unit substrate layers and a horizontal portion formed on at least one of the unit substrate layers such that intended paths are formed from the second common terminal A2 located on the bottom surface of the package substrate 200 to the second common electrode pads 532 and 542 located on the upper surface of the package substrate 200.

Figure 7:
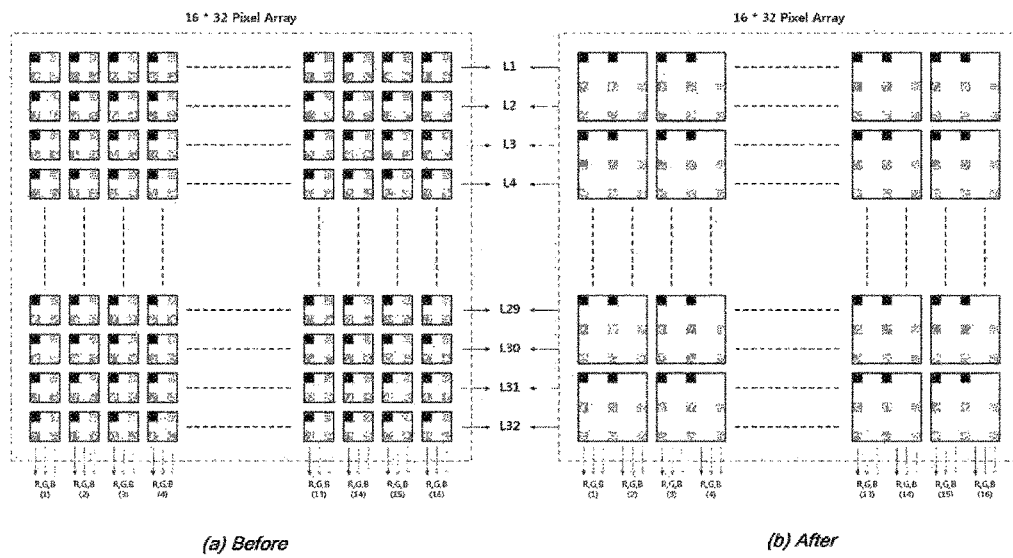
FIG. 7 compares an LED display module according to one aspect of the present invention using multi-pixel packages with a conventional LED display module using single-pixel packages.

FIG. 7 compares the LED display module of the present invention using the multi-pixel packages with a conventional LED display module using single-pixel packages.

The conventional LED display module uses single-pixel packages (16*32 pixel array) (left, (a) Before) and the LED display module of the present invention uses 8*16 multi-pixel packages (16*32 pixel array)(right, (b) After). As illustrated, scan signals L1 to L32 are applied to the pixels in the multi-pixel packages in rows in response to predetermined scan cycles and the LED chip units in the pixels in the column direction are controlled by the driver IC (D1 of FIG. 3). The use of the multi-pixel packages reduces the number of terminals to half (16 vs. 8 per 4 pixels). This enables efficient design of row-wise interconnections for applying scan signals and column-wise interconnection for supplying electric currents. In addition, the number of terminals per pixel can be significantly reduced, resulting in an increase in the degree of freedom of circuit design on the substrate.

Figure 8:
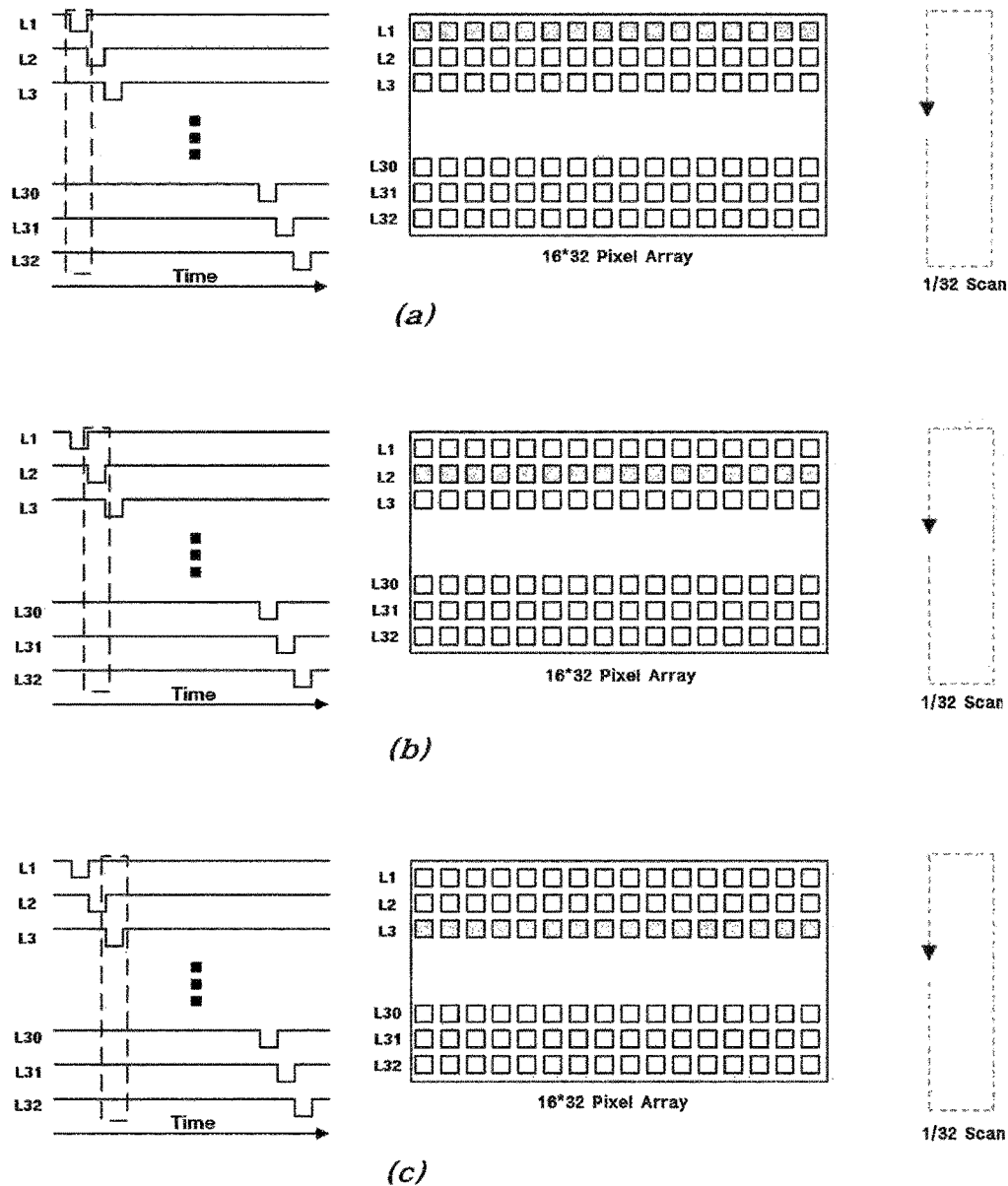
FIG. 8 illustrates a process for scanning pixels in rows in response to predetermined timing signals (scan signals) in an LED display module according to one aspect of the present invention.

FIG. 8 illustrates a process for scanning pixels in rows in response to predetermined timing signals (scan signals) in the LED display module of the present invention. The LED display module is an array of 16*32 pixels that are scanned in a total of 32 rows. In FIG. 8, (a) illustrates scanning of the pixels connected in common in the first row by L1, (b) illustrates scanning of the pixels connected in common in the second row by L2, and (c) illustrates scanning of the pixels connected in common in the third row by L3. This scanning is repeated for the 32 rows.

FIG. 9 illustrates the LED display module according to one aspect of the present invention in which individual electrode pads are arrayed in the row direction in a multi-pixel package 1', which is different from the longitudinal array of the individual electrode pads in FIG. 3. As illustrated, the multi-pixel package 1' includes pixels 10a', 10b', 10c', and 10d' in which the individual electrode pads are arrayed in lines in the row direction. That is, a first R individual electrode pad, a first G individual electrode pad, and a first B individual electrode pad in the first pixel 10a' may be arrayed in a line in the row direction, a second R individual electrode pad, a second G individual electrode pad, and a second B individual electrode pad in the second pixel 10b' may be arrayed in a line in the row direction, a third R individual electrode pad, a third G individual electrode pad, and a third B individual electrode pad in the third pixel 10c' may be arrayed in a line in the row direction, and a fourth R individual electrode pad, a fourth G individual electrode pad, and a fourth B individual electrode pad in the fourth pixel 10d' may be arrayed in a line in the row direction. This arrangement allows common electrode pads 512' and 522' to have linear structures rather than the "U" shape in FIG. 3. In the LED display module of the present invention, the pixels in the multi-pixel package and the pixels in the multi-pixel package adjacent in the row direction should also be connected in common to each other in the row direction, ensuring more efficient row-wise interconnections. Furthermore, the pixels (specifically, the LED chips in the pixels) adjacent in the column direction are connected in common to the driver IC (D1 in FIG. 2) in the column direction, which also ensures more efficient row-wise interconnections.

Each of the four pixels in the multi-pixel LED package may further include a W LED chip. The W LED chip may be an LED chip emitting white light with the aid of a fluorescent material or quantum dots. In this case, the multi-pixel LED package further includes a first W terminal (not illustrated) and a second W terminal (not illustrated). The first W terminal is connected in common to a first conductive electrode of the W LED chip in the first pixel and a first conductive electrode of the W LED chip in the third pixel. The second W terminal is connected in common to a first conductive electrode of the W LED chip in the second pixel and a first conductive electrode of the W LED chip in the fourth pixel. A second conductive electrode of the W LED chip in the first pixel and a second conductive electrode of the W LED chip in the second pixel are electrically connected to the first common terminal. A second conductive electrode of the W LED chip in the third pixel and a second conductive electrode of the W LED chip in the fourth pixel are electrically connected to the second common terminal. This construction enables control over the LED chips, as shown in Table 2.

TABLE 2

|  | First column | Second column |
| --- | --- | --- |
| Firs row | R LED chip (A1, R1) | R LED chip (A1, R2) |
|  | G LED chip (A1, G1) | G LED chip (A1, G2) |
|  | B LED chip (A1, B1) | B LED chip (A1, B2) |
|  | W LED chip (A1, W1) | W LED chip (A1, W2) |
| Second row | R LED chip (A2, R1) | R LED chip (A2, R2) |
|  | G LED chip (A2, G1) | G LED chip (A2, G2) |
|  | B LED chip (A2, B1) | B LED chip (A2, B2) |
|  | W LED chip (A2, W1) | W LED chip (A2, W1) |

Figure 10:
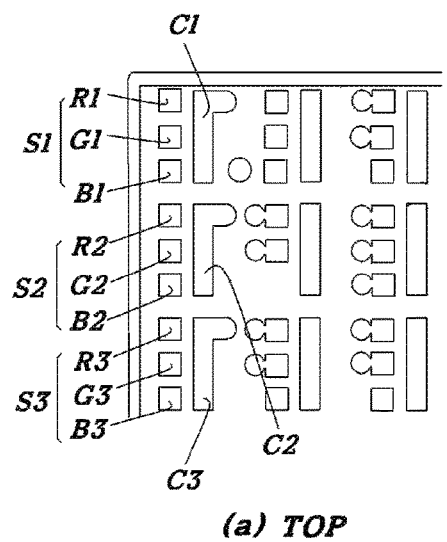
FIG. 10 illustrates individual layers constituting an exemplary structure of an LED display module according to a further aspect of the present invention.
Figure 10:
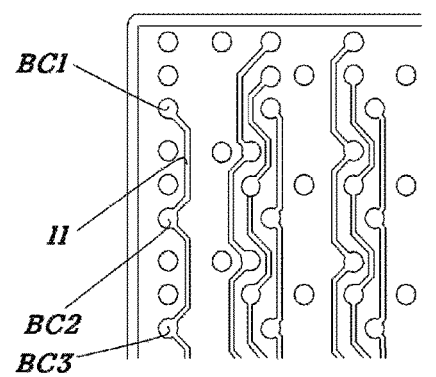
Figure 10:
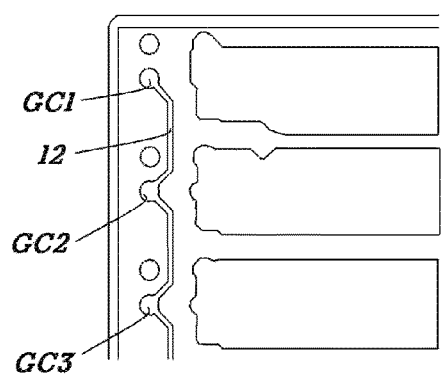
Figure 10:
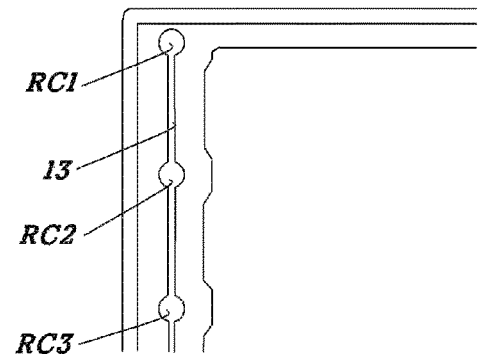
Figure 11:
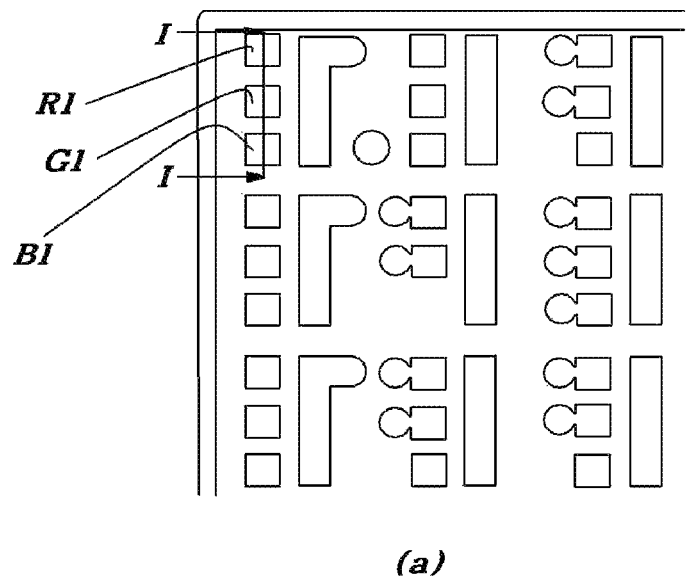
FIG. 11 schematically illustrates an exemplary vertical structure of FIG. 10.
Figure 11:
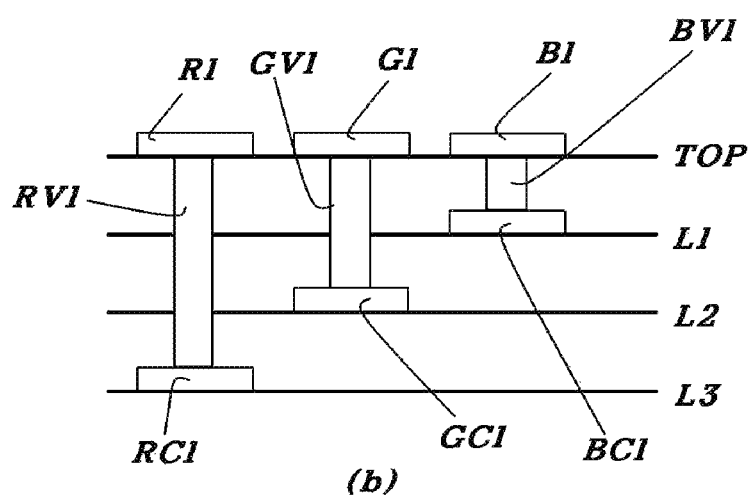

FIG. 10 illustrates one example of an LED package used for the fabrication of an LED display module according to a further aspect of the present invention. FIG. 11 illustrates a vertical structure of a multilayer substrate for implementing appropriate routing when LED chips are arrayed in the longitudinal direction to form one pixel, as illustrated in FIG. 10.

In FIG. 10, (a) to (d) illustrate individual layers of a multilayer substrate of the LED display module on which LED chips are mounted. The substrate includes a top layer a, a first layer b, a second layer c, and a third layer d arranged in this order from the top. A plurality of pixels are arranged on the top layer a. Each of the pixels includes a red LED chip, a green LED chip, and a blue LED chip. A plurality of common electrode pads C1, C2, and C3 and non-common electrode pads S1, S2, and S3 are disposed on the top layer a. The common electrode pads C1, C2, and C3 receive scan signals and anode terminals of the constituent red LEDs, green LEDs, and blue LEDs of the pixels are connected in common thereto. The non-common electrode pads S1, S2, and S3 are interconnected to a driver IC (not illustrated) for current sinking and cathode terminals of the red LEDs, the green LEDs, and the blue LEDs are connected thereto. For example, the non-common electrode pads S1 includes an R electrode pad R1 to which the cathode terminal of the red LED is connected, a G electrode pad G1 to which the cathode terminal of the green LED is connected, and a B electrode pad B1 to which the cathode terminal of the blue LED is connected. Due to these connections, the non-common electrode pads S1 are independently controlled by the pixel driver IC (not illustrated).

The first layer b is located under the top layer a. In the first layer b, B contacts BC1, BC2, and BC3 are formed at positions corresponding to the B electrode pads B1, B2, and B3 of the top layer and a B interconnection line 11 is formed through which the B contacts BC1, BC2, and BC3 are connected to one another. The B contacts BC1, BC2, and BC3 are connected to the corresponding B electrode pads B1, B2, and B3 through B vias BV1 ((b) of FIG. 11). The second layer c is located under the first layer b. In the second layer c, G contacts GC1, GC2, and GC3 are formed at positions corresponding to the G electrode pads G1,G2, and G3 of the top layer and a G interconnection line 12 is formed through which the G contacts GC1, GC2, and GC3 are connected to one another. The G contacts GC1, GC2, and GC3 are connected to the corresponding G electrode pads G1, G2, and G3 through G vias GV1 ((b) of FIG. 11). The third layer d is located under the second layer c. In the third layer d, R contacts RC1, RC2, and RC3 are formed at positions corresponding to the R electrode pads R1,R2, and R3 of the top layer and an R interconnection line 13 is formed through which the R contacts RC1, RC2, and RC3 are connected to one another. The R contacts RC1, RC2, and RC3 are connected to the corresponding R electrode pads R1, R2, and R3 through R vias RV1 ((b) of FIG. 11). The common electrode pads C1, C2, and C3 are disposed such that scan signals are received in rows through separate layers or row-wise interconnections (not illustrated) formed in one of the first to third layers.

In an LED display module having a structure in which R electrode pads, G electrode pads, and B electrode pads as non-common electrode pads are arrayed in the longitudinal direction and cathode terminals of red LEDs, green LEDs, and blue LEDs are connected and mounted thereto, the R electrode pads, the G electrode pads, and the B electrode pads adjacent in the longitudinal direction should be independently connected to one another. Due to this structure, interconnection areas and intervals between interconnection lines are limited. Thus, at least 4 layers (TOP, Layer1, Layer2, and Layer3) are required to prevent shorting between the interconnection lines or to achieve high-quality resolution. Further, vertical connections using vias should also be taken into consideration, which makes the implementation of routing considerably complex.

Figure 12:
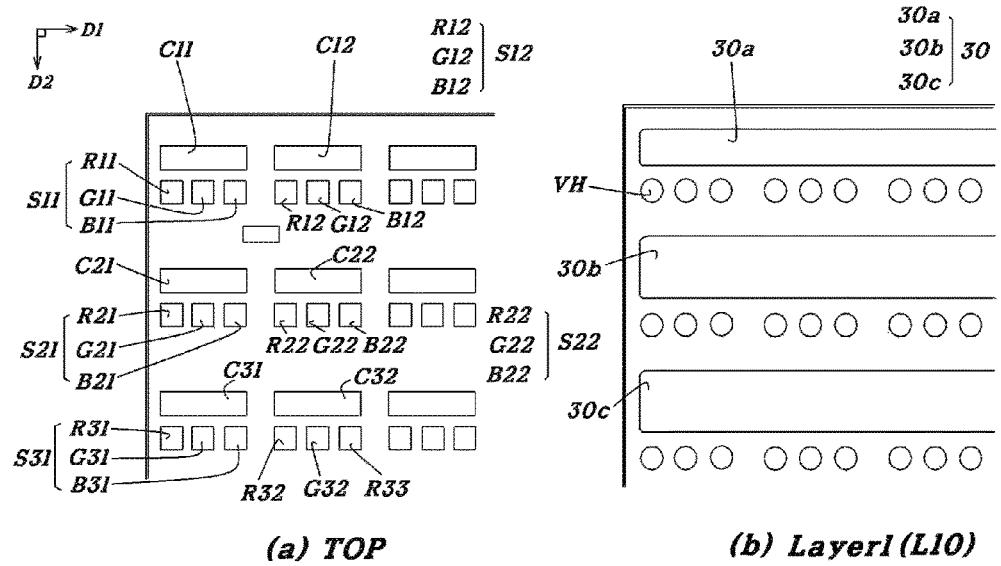
FIG. 12 illustrates individual layers constituting of an exemplary structure of an LED display module according to another aspect of the present invention.
Figure 12:
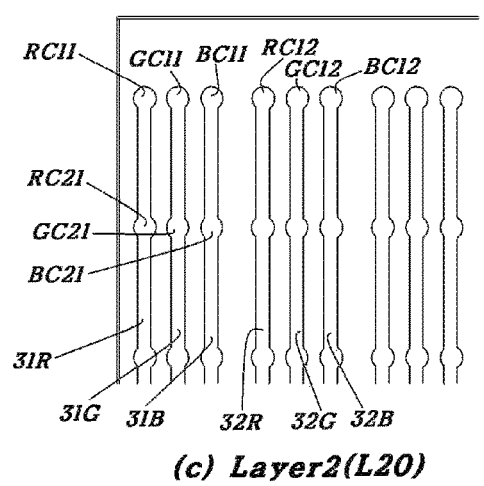
Figure 13:
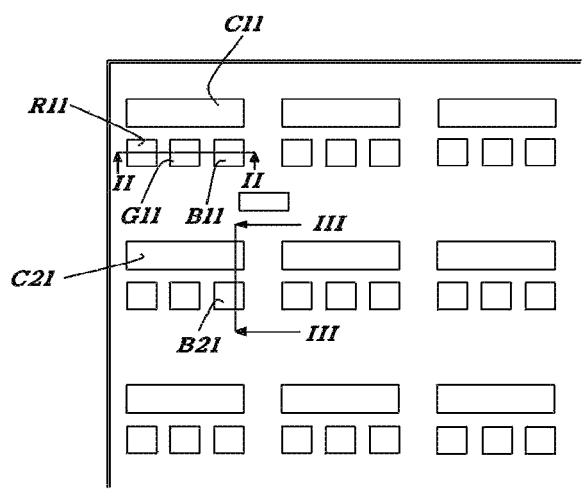
FIG. 13 schematically illustrates exemplary vertical structures of FIG. 12.
Figure 13:
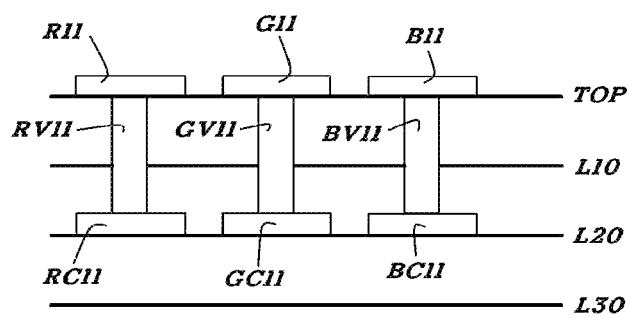
Figure 13:
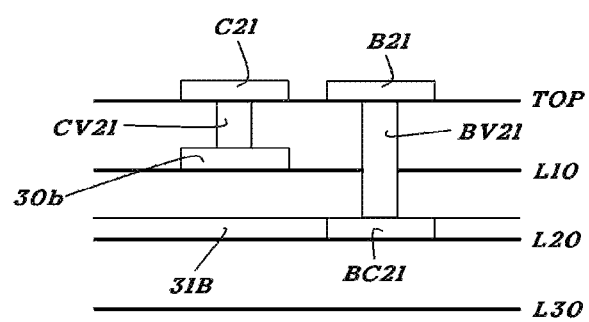

FIG. 12 illustrates individual layers of an LED display module according to another aspect of the present invention and FIG. 13 schematically illustrates vertical structures of FIG. 12.

The LED display module illustrated in FIGS. 12 and 13 includes a substrate with a reduced number of constituent layers and pixels arranged at small intervals without complex routing.

Referring to FIGS. 12 and 13, the LED display module of the present invention includes a micro-LED array, a substrate mounted with pixels, and a plurality of common electrode pads and a plurality of non-common electrode pads arranged on the substrate.

The micro-LED array includes a plurality of pixels arrayed in a matrix with rows and columns in the directions D1 and D2, respectively. Each of the pixels includes a red LED, a green LED, and a blue LED. Although not directly illustrated in the figures, cathodes of the LEDs are mounted on the respective non-common electrode pads S11, S21, and S31 and anodes of the LEDs are mounted on the respective common electrode pads C11, C12, and C13. For example, in the pixel in the first row and the first column, the red LED is connected to the R electrode pad R11 of the non-common electrode pad S11 and the common electrode pad C11, the green LED is connected to the G electrode pad G11 of the non-common electrode pad S11 and the common electrode pad C11, and the blue LED is connected to the B electrode pad B11 of the non-common electrode pad S11 and the common electrode pad C11. In this case, the cathodes of the LEDs are connected in common to the respective non-common electrode pads and the anodes of the LEDs are connected in common to the common electrode pad C11.

Herein, the row direction D1 refers to the direction along which scan signals are applied in common when scanned in rows and the column direction D2 refers to the direction for current sinking. Particularly, the pixels are connected to one another in the row direction D1 and the LEDs in the pixels are connected to one another in the column direction. It will be understood that when an element is referred to as being "connected" to another element, the two elements can be directly or electrically connected to each other. The red LED, the green LED, and the blue LED constituting each of the pixels in the LED display module of the present invention are preferably flip-bonded.

The plurality of LEDs of the pixels are mounted on the substrate in the row direction D1 and the column direction D2. The substrate includes a top layer TOP, a first layer L10 (Layer1) formed under the top layer TOP, and a second layer L20 (Layer2) formed under the first layer L10, which are illustrated in (a), (b), and (c) of FIG. 13, respectively. As illustrated in FIG. 13, the substrate may further include another layer under the second layer L20.

In the final full-color LED display module, the pixels are connected in common in rows to receive scan signals in rows in response to predetermined scan cycles in the row direction D1 (FIG. 10) and are connected to a driver IC (not illustrated) for current sinking in the column direction D2. The pixels are connected independently in the column direction D2 such that the LEDs in each pixel are controllable individually. It is to be understood that the electrode pads (for example, R11, R22, and R31) mounted with the cathodes of the adjacent LEDs are also interconnected in common in the row direction D2. Thus, the full-color LED display module is constructed such that scan signals are received in rows in response to predetermined scan cycles from the top to the bottom or vice versa and the red LEDs, the green LEDs, and the blue LEDs in the pixels are independently connected in the column direction for current sinking, enabling control over color or brightness.

A detailed discussion of the individual layers will be given below. As illustrated in (a) of FIG. 12, the plurality of common electrode pads C11, C21, C31, . . . and the plurality of non-common electrode pads S11, S21, S31, . . . are formed on the top layer TOP of the substrate. One common electrode pad (for example, C11) and one corresponding non-common electrode pad S11 are provided in each pixel (specifically, the red LED, the green LED, and the blue LED of the pixel). The R electrode pad R11, the G electrode pad G11, and the B electrode pad B11 are provided in one non-common electrode pad S11. In each pixel, the cathode terminals of the LEDs are connected to the R electrode pad R11, the G electrode pad G11, and the B electrode pad B11 and the anode terminals of the LEDs are connected in common to the common electrode pad C11. The common electrode pads (for example, C11 and C12) adjacent in the row direction D1 receive common scan signals through row-wise interconnection lines (30 in (b)). In each of the non-common electrode pads (for example, S11) to which the LEDs constituting the pixel are connected, the R electrode pad R11, the G electrode pad G11, and the B electrode pad B11 are arrayed in the row direction D1. The non-common electrode pads (for example, S11 and S21) adjacent in the column direction D2 are connected to each other through common column-wise interconnection lines (31R, 31G, and 31B in (c)).

Thus, the R electrode pad R11, the G electrode pad G11, and the B electrode pad B11 of one non-common electrode pad S11 corresponding to one common electrode pad (for example, C11) are arrayed in the row direction such that the red LED, the green LED, and the blue LED are arrayed in the row direction D1 in one pixel. When the number of pixels is represented by m*n (where m is the number of columns and n is the number of rows), the number of row-wise interconnection lines (reference numerals 30a, 30b, and 30c in (b) of FIG. 12) is n and the number of column-wise interconnection lines (reference numerals 31R, 31G, 31B, . . . in (c) of FIG. 12) is 3m.

In order to make the row-wise interconnection lines 30 in the first layer L10 located under the top layer TOP and the column-wise interconnection lines 31R, 31G, and 31B in the second layer L20 located under the first layer L10 compact, it is preferred that the common electrode pads (for example, C11 and C12) adjacent in the row direction D1 are pre-aligned, the R electrode pads (for example, R11 and R21) of the non-common electrode pads adjacent in the column direction D2 are pre-aligned in the column direction D2, the G electrode pads (for example, G11 and G21) of the non-common electrode pads adjacent in the column direction D2 are pre-aligned in the column direction D2, and the B electrode pads (for example, B11 and B21) of the non-common electrode pads adjacent in the column direction D2 are pre-aligned in the column direction D2 in the column direction D2.

The first layer L10 located under the top layer TOP is illustrated in (b) of FIG. 12. The number of the row-wise interconnection lines 30 formed in the first layer L10 corresponds to the number of the rows. Scan signals are applied in rows in response to predetermined scan cycles through the row-wise interconnection lines 30, and as a result, an operating voltage is supplied to each pixel. The row-wise interconnection lines 30 of the first layer L10 are connected to the common electrode pads of the overlying top layer TOP in rows. The common electrode pads (for example, C21) formed on the top layer TOP are connected to the interconnection lines (for example, 30b) formed on the first layer through vias CV21 (see the cross-section (c) of FIG. 13). Only one via CV21 is illustrated in FIG. 13 but a plurality of vias CV21 are provided corresponding to the positions of the common electrode pads because the common electrode pads should be connected to the row-wise interconnection lines of the first layer L10.

The first layer L10 may have via holes VH through which vias (RV11, GV11, and BV11 in (b) of FIG. 13) penetrate to connect the column-wise interconnection lines (for example, 31R, 31G, and 31B) formed on the underlying second layer L20 to the non-common electrode pads S11, S21, and S31 formed on the overlying top layer TOP.

The second layer L20 located under the first layer L10 is illustrated in (c) of FIG. 12. The column-wise interconnection lines 31R, 31G, 31B, 32R, 32G, 32B, . . . are formed on the second layer L20. The number of the column-wise interconnection lines may correspond to the number of the columns (m) of the pixels. The number of the column-wise interconnection lines is not in a one-to-one relationship with the number of the columns of the pixels. In (c) of FIG. 12, 3m interconnection lines are formed such that the LEDs in each pixel can be controlled independently. For example, the m column-wise interconnection lines designated by reference numerals 31R, 31G and 31B are provided in one set. The column-wise interconnection line 31R is an R line, the column-wise interconnection line 31G is a G line, and the column-wise interconnection line 31B is B line. For example, the R electrode pads R11, R21, and R31 adjacent in the column direction are connected to the R line 31R, the G electrode pads G11, G21, and G31 adjacent in the column direction are connected to the G line 31G, and the B electrode pads B11, B21, and B31 adjacent in the column direction are connected to the B line 31B.

For example, contacts (for example, RC11) with relatively wide interconnection widths may be formed in the column-wise interconnection lines (for example, 31R) for improved electrical connection with the non-common electrode pads (for example, R11) disposed on the top layer TOP through vias (RV11 in (b) of FIG. 13).

Referring next to FIG. 13, a further explanation will be given of the interconnections among the top layer TOP, the first layer L10, and the second layer L20.

(b) of FIG. 13 is a cross-sectional view taken along line II-II of (a) and explains vertical structures of the non-common electrode pads R11, G11, and B11. (c) of FIG. 13 is a cross-sectional view taken along line of (a) and explains vertical structures of the common electrode pad C21 and the non-common electrode pad B21.

As illustrated in the II-II cross-section ((b) of FIG. 13), the non-common electrode pads R11, G11, and B11 are connected to the corresponding contacts RC11, GC11, and BC11 in the column-wise interconnections 31R, 31G, and 31B (FIG. 12) formed on the second layer L20. The contacts RC11, GC11, and BC11 are connected to the non-common electrode pads R11, G11, and B11 through second vias RV11, GV11, and BV11 penetrating the via holes VH (FIG. 12) formed in the first layer L10. That is, each pixel is formed in such a manner that the R electrode pad R11 connected with the red LED is connected to the contact RC11 in the column-wise interconnection line 31R formed on the second layer L20 through the second via RV11, the G electrode pad G11 connected with the green LED is connected to the contact GC11 in the column-wise interconnection line 31G formed on the second layer L20 through the second via GV11, and the B electrode pad B11 connected with the blue LED is connected to the contact BC11 in the column-wise interconnection line 31B formed on the second layer L20 through the second via BV11.

As illustrated in the cross-section ((c) of FIG. 13), the non-common electrode pad B21 is connected to the contact BC21 in the column-wise interconnection line 31B formed on the second layer, whereas the common electrode pad C21 is connected to the row-wise interconnection line 30b formed on the first layer L10 through the first via CV21. Although only the cross-section of the common electrode pad C21 is illustrated in (c) of FIG. 13, the same connections can apply to all common electrode pads. Thus, all common electrode pads are connected to the row-wise interconnection lines formed on the first layer L10 through the first vias. As mentioned earlier, scan signals are applied in rows through the row-wise interconnection lines (30a, 30b, and 30c in FIG. 3) formed on the first layer L10.

In these figures, the numbers of the common electrode pads and the non-common electrode pads formed on the top layer TOP, the number of the row-wise interconnection lines formed on the first layer L10, and the number of the column-wise interconnection lines formed on the second layer are 3*3, 27 (9 R electrode pads, 9 G electrode pads, and 9 B electrode pads), 3, and 3 sets (each including 3 sub-lines), respectively. The numbers of the common electrode pads, the non-common electrode pads, the row-wise interconnection lines, and the column-wise interconnection lines are not limited and may vary depending on the numbers of the rows and columns (m*n).

Under an assumption that four (2*2) pixels are arranged in the LED display module, an explanation will be given with reference to FIGS. 3 and 4.

The pixels are divided into first, second, third, and fourth pixels. The first pixel is adjacent to the second pixel in the row direction D1, the third pixel is adjacent to the fourth pixel in the row direction D1, the first pixel is adjacent to the third pixel in the column direction D2, and the second pixel is adjacent to the fourth pixel in the column direction D2.

On a top layer TOP mounted with constituent LEDs of the first to fourth pixels, a first common electrode pad C11 is formed corresponding to the first pixel, a second common electrode pad C12 is formed corresponding to the second pixel, a third common electrode pad C21 is formed corresponding to the third pixel, and a fourth common electrode pad C22 is formed corresponding to the fourth pixel. A first non-common electrode pad S11 corresponding to the first pixel, a second non-common electrode pad S12 corresponding to the second pixel, a third non-common electrode pad S21 corresponding to the third pixel, and a fourth non-common electrode pad S22 corresponding to the fourth pixel are formed on the top layer TOP. Each of the first to fourth non-common electrode pads S11, S12, S21, and S22 includes an R electrode pad, a G electrode pad, and a B electrode pad. Specifically, the first non-common electrode pad S11 includes a first R electrode pad R11, a first G electrode pad G11, and a first B electrode pad B11, the second non-common electrode pad S12 includes a second R electrode pad R12, a second G electrode pad G12, and a second B electrode pad B12, the third non-common electrode pad S21 includes a third R electrode pad R21, a third G electrode pad G21, and a third B electrode pad B21, and the fourth non-common electrode pad S22 includes a fourth R electrode pad R22, a fourth G electrode pad G22, and a third B electrode pad B22. A cathode terminal of a red LED is connected to each R electrode pad, a cathode terminal of a green LED is connected to each G electrode pad, and a cathode terminal of a blue LED is connected to each B electrode pad. Anode terminals of the red LED, the green LED, and the blue LED in each pixel are connected in common to the corresponding common electrode pad. In each pixel, the red LED, the green LED, and the blue LED are arrayed in the row direction D1.

A first row-wise interconnection line 30a and a second row-wise interconnection line 30b are formed on a first layer L10 to connect the first common electrode pad C11 to the second common electrode pad C12. Further, via holes VH penetrate the first layer L10 to connect the non-common electrode pads to column-wise interconnection lines 31R, 31G, 31B, 32R, 32G, and 32B formed on a second layer L20. The common electrode pads are connected to the row-wise interconnection lines through first vias (CV21 in (c) of FIG. 13).

First column-wise interconnection lines 31R, 31G, and 31B and second column-wise interconnection lines 32R, 32G, and 32B are formed on the second layer L20. The first column-wise interconnection lines 31R, 31G, and 31B include the first R interconnection line 31R, the first G interconnection line 31G, and the first B interconnection line 31B. The second column-wise interconnection lines 32R, 32G, and 32B include the second R interconnection line 32R, the second G interconnection line 32G, and the second B interconnection line 32B. In the column-wise interconnection lines, contacts RC11, RC21, GC11, GC21, RC11, GC21, RC12, GC12, BC12, RC22, GC22, and BC22 are formed at positions corresponding to the non-common electrode pads formed on the top layer. The contacts have larger widths than the other portions of the column-wise interconnection lines. The contacts are connected to the non-common electrode pads through second vias (RV11, GV11, and BV11 in (b) of FIG. 13).

As is apparent from the above description, the cathode terminals of the LEDs are connected independently to the non-common electrode pads arrayed in the row direction in each pixel of the LED display module according to the present invention. Due to this construction, compact routing can be implemented and pixel intervals can be reduced.

What is claimed is:
1. An LED display module comprising:
a substrate;
a plurality of multi-pixel packages arrayed in a matrix with rows and columns on the substrate, each multi-pixel package comprising:
a package substrate;
a plurality of pixels on the package substrate, each pixel comprising a red LED chip, a green LED chip, and a blue LED chip; and
a plurality of common electrode pads disposed on an upper surface of the package substrate, each common electrode pad being connected in common to anode terminals of the LED chips of the corresponding pixel; and
a driver IC adapted to independently control the pixels of the multi-pixel packages,
wherein the plurality of common electrode pads that are disposed adjacent to one another in the row direction are connected to each other.

2. The LED display module according to claim 1, wherein each of the multi-pixel packages comprises the same number of common terminals disposed on the bottom surface of the package substrate as the number of the rows.

3. The LED display module according to claim 1, wherein each of the multi-pixel packages comprises a common connector through which common electrode pads assigned to the respective pixels are connected to common terminals disposed on the bottom surface of the package substrate.

4. The LED display module according to claim 1, wherein the multi-pixel packages adjacent in the row direction receive common scan signals applied to row-wise interconnection lines through common terminals disposed in the multi-pixel packages.

5. The LED display module according to claim 1, wherein each of the multi-pixel packages comprises individual electrode pads disposed on the upper surface of the package substrate and to which cathode terminals of the LED chips are connected independently.

6. The LED display module according to claim 5, wherein the individual electrode pads are arrayed in lines in the column direction.

7. The LED display module according to claim 5, wherein the individual electrode pads are arrayed in lines in the row direction.

8. The LED display module according to claim 1, wherein each of the multi-pixel packages comprises R terminals, G terminals, and B terminals disposed on the bottom surface of the package substrate for the red LED chips, the green LED chips, and the blue LED chips, respectively, and each of the numbers of the R terminals, the G terminals, and the B terminals in each multi-pixel package is the same as the number of the columns in the multi-pixel package.

9. The LED display module according to claim 1, wherein each of the multi-pixel packages comprises R individual electrode pads, G individual electrode pads, and B individual electrode pads disposed on the upper surface of the package substrate and to which cathode terminals of the LED chips are connected independently, R connection means through which the R individual electrode pads are connected to R terminals, G connection means through which the G individual electrode pads are connected to G terminals, and B connection means through which the B individual electrode pads are connected to B terminals.

* * * * *